US006938340B2

(12) United States Patent
Haluzak et al.

(10) Patent No.: US 6,938,340 B2
(45) Date of Patent: Sep. 6, 2005

(54) METHOD OF FORMING A PRINTHEAD USING A SILICON ON INSULATOR SUBSTRATE

(75) Inventors: Charles C. Haluzak, Corvallis, OR (US); Colby Van Vooren, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 565 days.

(21) Appl. No.: 10/003,962

(22) Filed: Nov. 14, 2001

(65) Prior Publication Data

US 2003/0058309 A1 Mar. 27, 2003

Related U.S. Application Data

(62) Division of application No. 09/654,869, filed on Sep. 5, 2000, now Pat. No. 6,398,348.

(51) Int. Cl.[7] .......................... B21D 53/76; H05B 3/16; H01L 21/70

(52) U.S. Cl. .......................... 29/890.1; 29/611; 438/21; 438/749; 216/27; 216/79; 216/99

(58) Field of Search ............................ 29/890.1, 25.35, 29/611; 438/21, 154, 210, 749, 238; 216/27, 79, 99; 347/61–63, 20, 24, 65, 66

(56) References Cited

U.S. PATENT DOCUMENTS

| | | | | |
|---|---|---|---|---|
| 4,894,664 A | | 1/1990 | Tsung Pan | 347/63 |
| 5,387,314 A | | 2/1995 | Baughman et al. | 156/643 |
| 5,679,593 A | * | 10/1997 | Miller et al. | 438/210 |
| 5,682,188 A | * | 10/1997 | Meyer et al. | 347/61 |
| 5,706,041 A | | 1/1998 | Kubby | 347/65 |
| 5,773,326 A | * | 6/1998 | Gilbert et al. | 438/154 |
| 5,851,412 A | | 12/1998 | Kubby | 216/27 |
| 5,852,459 A | | 12/1998 | Pawlowski, Jr. et al. | 347/86 |
| 5,876,497 A | | 3/1999 | Atoji | 117/85 |
| 5,971,527 A | | 10/1999 | Peeters et al. | 347/65 |
| 6,000,787 A | | 12/1999 | Weber et al. | 347/65 |
| 6,033,581 A | | 3/2000 | Kobayashi | 216/27 |
| 6,103,099 A | | 8/2000 | Wittenbrink et al. | 208/27 |

FOREIGN PATENT DOCUMENTS

| | | | | |
|---|---|---|---|---|
| JP | 59-124871 | * | 7/1984 | 347/62 |

* cited by examiner

*Primary Examiner*—A. Dexter Tugbang

(57) ABSTRACT

Described herein is a method of forming a printhead. A silicon-on-insulator (SOI) substrate, including a first silicon layer, a second silicon layer, and an oxide layer between the first silicon layer and the second silicon layer, is provided. A plurality of thin film layers is formed on a first surface of the substrate. At least one of the layers forms a plurality of ink ejection elements. Ink feed holes are formed through the thin film layers. An opening is formed in the substrate by (a) etching the first silicon layer of the SOI substrate using a wet etch to etch a trench in the first silicon layer extending to the oxide layer; (b) etching an opening in the oxide layer; and (c) etching an opening in the second silicon layer to form an ink path between a backside of the SOI substrate and a topside of the SOI substrate.

6 Claims, 7 Drawing Sheets

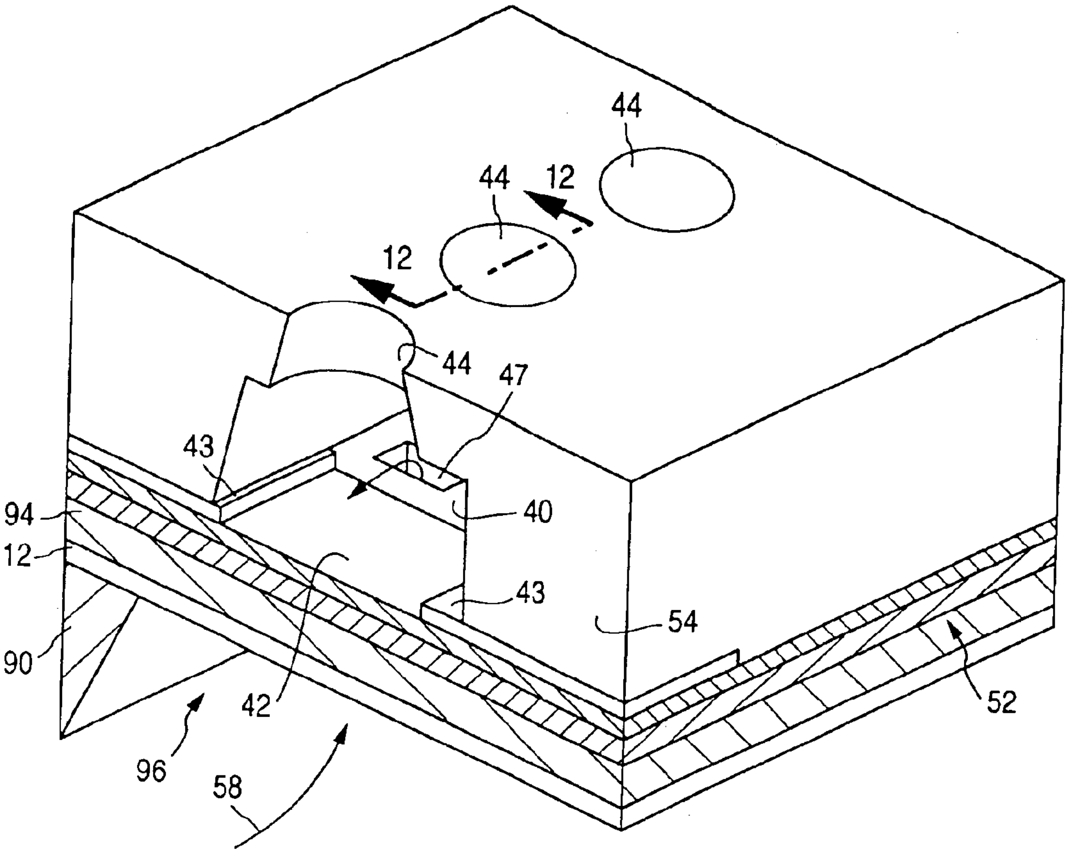
FIG. 11
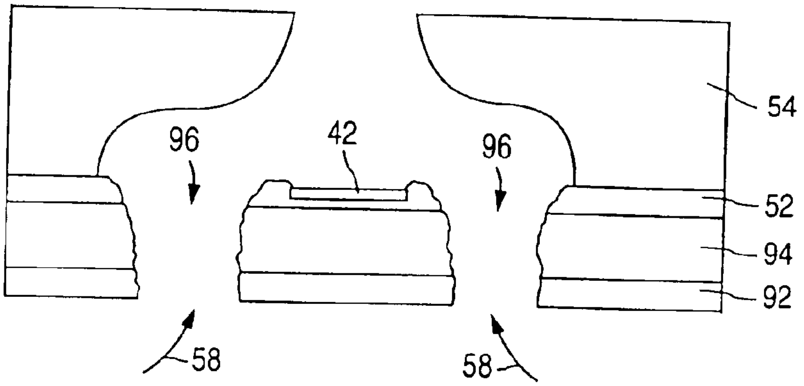
FIG. 12
FIG. 13
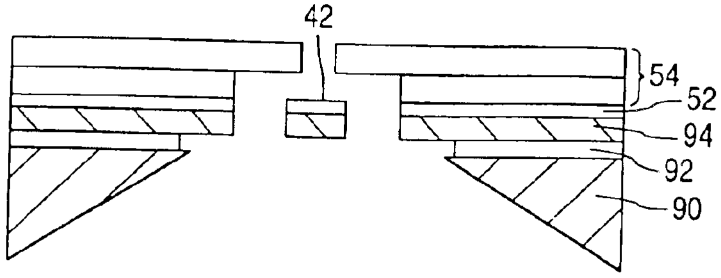

METHOD OF FORMING A PRINTHEAD USING A SILICON ON INSULATOR SUBSTRATE

CROSS-REFERENCE TO RELATED APPLICATIONS

This is a divisional of application Ser. No. 09/654,869 filed on Sep. 5, 2000 now U.S. Pat. No. 6,398,348, which is hereby incorporated by reference herein.

This invention relates to U.S. application Ser. No. 09/384,849, filed Aug. 27, 1999, entitled "Fully Integrated Inkjet Printhead Having Multiple Ink Feed Holes Per Nozzle," by Naoto Kawamura et al. This invention also relates to U.S. application Ser. No. 09/384,814, filed Aug. 27, 1999, entitled "Fully Integrated Thermal Inkjet Printhead Having Etched Back PSG Layer," by Naoto Kawamura et al. This application also relates to U.S. application Ser. No. 09/384,817, filed Aug. 27, 1999, entitled "Fully Integrated Thermal Inkjet Printhead Having Thin Film Layer Shelf," by Naoto Kawamura et al. These three applications are assigned to the present assignee and incorporated herein by reference.

FIELD OF THE INVENTION

This invention relates to inkjet printers and, more particularly, to a monolithic printhead for an inkjet printer.

BACKGROUND

The various fully integrated thermal inkjet printheads described in the above-identified applications by Naoto Kawamura et al. include thin film layers containing heater resistors, conductors, and other layers over a silicon substrate. The backside of the substrate is etched completely through (forming a trench), and holes are formed through the thin film layers to allow ink to flow from the backside of the substrate, through the substrate, and into vaporization chambers formed on the top surface of the substrate. Energizing a heater resistor vaporizes a portion of the ink within a vaporization chamber, creating a bubble, which causes a droplet of ink to be ejected out of an associated nozzle in an orifice member formed over the thin film layers. Multiple embodiments were shown in the previous applications. FIGS. 1–3 herein are reproduced from the previous applications to place into context the present improvement over the printheads disclosed in the previous application.

FIG. 1 is a perspective view of one type of inkjet print cartridge 10 which may incorporate the printhead structures described herein. The print cartridge 10 of FIG. 1 is the type that contains a substantial quantity of ink within its body 12, but another suitable print cartridge may be the type that receives ink from an external ink supply either mounted on the printhead or connected to the printhead via a tube.

The ink is supplied to a printhead 14. Printhead 14 channels the ink into ink ejection chambers, each chamber containing an ink ejection element. Electrical signals are provided to contacts 16 to individually energize the ink ejection elements to eject a droplet of ink through an associated nozzle 18. The structure and operation of conventional print cartridges are very well known.

FIG. 2 is a cross-sectional view of a portion of the printhead of FIG. 1 taken along line 2—2 in FIG. 1. Although a printhead may have 300 or more nozzles and associated ink ejection chambers, detail of only a single ink ejection chamber need be described in order to understand the invention. It should also be understood by those skilled in the art that many printheads are formed on a single silicon wafer and then separated from one another using conventional techniques.

In FIG. 2, a silicon substrate 20 has formed on it various thin film layers 22. The thin film layers 22 include a resistive layer for forming resistors 24. Other thin film layers perform various functions, such as providing electrical insulation from the substrate 20, providing a thermally conductive path from the heater resistor elements to the substrate 20, and providing electrical conductors to the resistor elements. One electrical conductor 25 is shown leading to one end of a resistor 24. A similar conductor leads to the other end of the resistor 24. In an actual embodiment, the resistors and conductors in a chamber would be obscured by overlying layers.

Ink feed holes 26 are formed completely through the thin film layers 22.

An orifice layer 28 is deposited over the surface of the thin film layers 22 and developed to form ink ejection chambers 30, one chamber per resistor 24. A manifold 32 is also formed in the orifice layer 28 for providing a common ink channel for a row of ink ejection chambers 30. The inside edge of the manifold 32 is shown by a dashed line 33. Nozzles 34 may be formed by laser ablation using a mask and conventional photolithography techniques. Chemical etching may also be used to form the orifice layer.

The silicon substrate 20 is etched to form a trench 36 extending along the length of the row of ink feed holes 26 so that ink 38 from an ink reservoir may enter the ink feed holes 26 for supplying ink to the ink ejection chambers 30.

In one embodiment, each printhead is approximately one-half inch long and contains two offset rows of nozzles, each row containing 150 nozzles for a total of 300 nozzles per printhead. The printhead can thus print at a single pass resolution of 600 dots per inch (dpi) along the direction of the nozzle rows or print at a greater resolution in multiple passes. Greater resolutions (e.g., 1200 dpi) may also be printed along the scan direction of the printhead.

In operation, an electrical signal is provided to heater resistor 24, which vaporizes a portion of the ink to form a bubble within an ink ejection chamber 30. The bubble propels an ink droplet through an associated nozzle 34 onto a medium. The ink ejection chamber is then refilled by capillary action.

FIG. 3 is a cross-sectional perspective view along line 2—2 in FIG. 1 illustrating a single ink ejection chamber 40 in another embodiment of a monolithic printhead described in the prior applications.

In FIG. 3, a silicon substrate 50 has formed on it a plurality of thin film layers 52, including a resistive layer and an AlCu layer that are etched to form the heater resistors 42. AlCu conductors 43 are shown leading to the resistors 42.

Ink feed holes 47 are formed through the thin film layers 52 to extend to the surface of the silicon substrate 50. An orifice layer 54 is then formed over the thin film layers 52 to define ink ejection chambers 40 and nozzles 44. The silicon substrate 50 is etched to form a trench 56 extending the length of the row of ink ejection chambers. The trench 56 may be formed prior to the orifice layer. Ink 58 from an ink reservoir is shown flowing into trench 56, through ink feed hole 47, and into chamber 40.

The applications incorporated by reference describe in detail the manufacturing processes for forming the embodiments of FIGS. 2 and 3 and need not be repeated herein. Such processes may use conventional techniques for forming printhead thin film layers.

The thin film layers formed over the substrate in FIGS. 2 and 3 are only on the order of 4 microns thick and, thus, when the underlying silicon is etched away, the thin film (or membrane) is prone to buckling when the trench widths are greater than about 70 microns. Such buckling of unsupported membrane widths greater than 70 microns cause ink drop trajectory errors. Cracks may also be a problem within the membrane shelf and are catastrophic, leading to resistor "opens" and gross topology changes. These are serious issues needed to be resolved to increase the longevity of these devices.

An additional issue regarding FIGS. 2 and 3 is that there is not satisfactory heat transfer between the heater resistors and the bulk silicon via the membrane at high firing frequencies. This leads to overheating of the membrane. Such overheating of the membrane, and particularly the membrane backside, may heat the ink contacting the backside of the membrane to the point where the ink is vaporized, and bubbles are formed in unwanted areas. These bubbles can cause vapor lock, preventing refill of the firing chambers. One attempted solution was to deposit a layer of metal on the backside of the membrane, but this approach has various drawbacks and is thus not a viable long-term solution.

Accordingly, what is needed is a technique for accurately controlling the width of the backside substrate etching to limit the width of any unsupported membrane to a desired width. It would be further desirable to avoid unsupported membrane widths altogether. What is also desirable is a technique for increasing the heat transfer between the heater resistors and the bulk substrate to prevent the above-described problems from occurring.

SUMMARY

We have overcome the above-described problems by using a silicon-on-insulator (SOI) wafer as the starting substrate. In one embodiment, the substrate consists of a relatively thick layer of silicon (e.g., 660 microns) on which is formed a layer of thermal oxide approximately 5,000 Angstroms, on top of which is a thin layer of silicon (e.g., 10 microns). Thin film layers, including the heater resistors, are formed over the thin silicon layer. An orifice layer containing nozzles and vaporization chambers is then formed.

A backside trench is etched into the thick layer of silicon using a TMAH etch, and the oxide acts as an etch stop. An etch step using, for example, BOE, then removes the exposed portion of the thermal oxide layer between the two silicon layers. A second TMAH etch is then performed to etch through the thin remaining silicon layer to form ink channels completely through the SOI wafer leading to the vaporization chambers.

The oxide layer in conjunction with the thin silicon layer provides much greater control over the width of the trench so as to provide a very predictable silicon membrane beneath the heater resistors. This silicon membrane not only prevents buckling but also acts to increase the heat transfer between the heater resistors and the bulk silicon.

In another embodiment, an SOI wafer is not used, and the disclosed process leaves a thin silicon membrane remaining beneath the heater resistors.

BRIEF DESCRIPTION OF THE DRAWINGS

FIG. 11 is a cross-sectional, perspective view of a portion of a monolithic printhead similar to FIG. 3 but using a SOI wafer as the starting substrate.

FIG. 12 is a cross-sectional, perspective view of a printhead along line 12—12 in FIG. 11 illustrating ink feed holes through the thin film layers and the thin silicon membrane.

FIG. 13 is a simplified cross-sectional view of the printhead of FIG. 12.

DETAILED DESCRIPTION OF THE EMBODIMENTS

Figure 1:
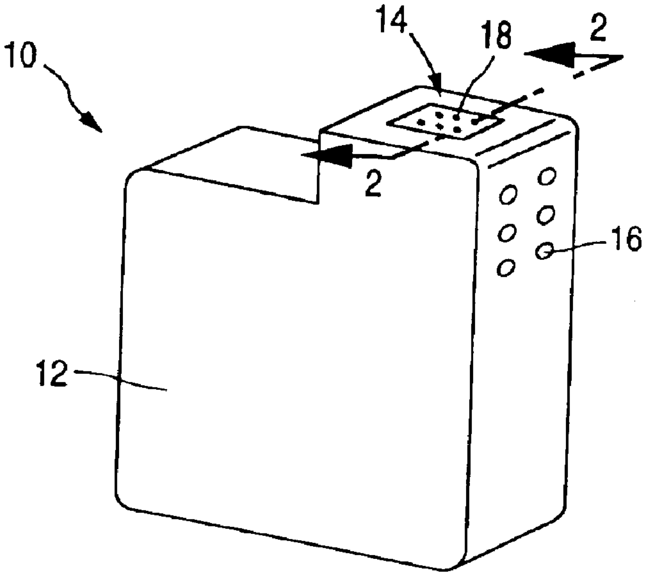
FIG. 1 is a perspective view of one type of print cartridge that may incorporate a monolithic printhead of the present invention.
Figure 2:
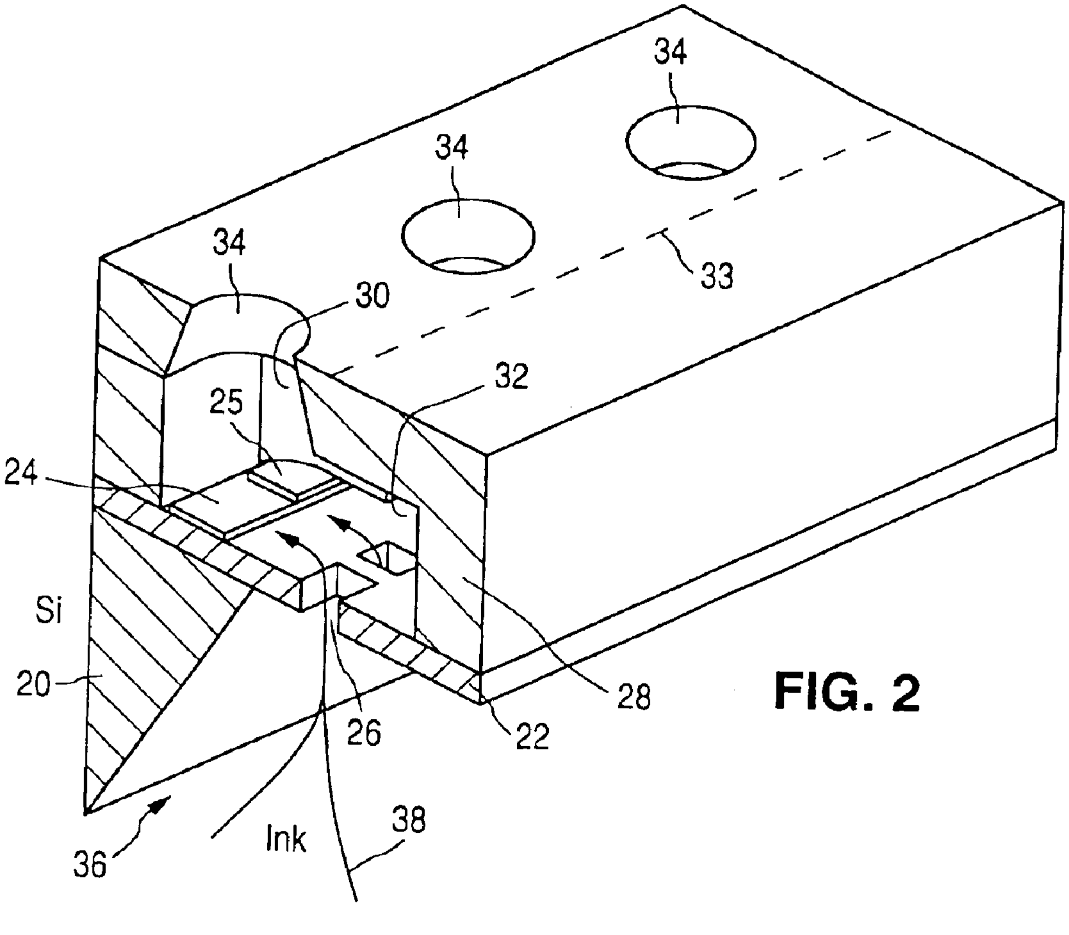
FIG. 2 is a cross-sectional, perspective view of a portion of a monolithic printhead disclosed in a previous application assigned to Hewlett-Packard.
Figure 3:
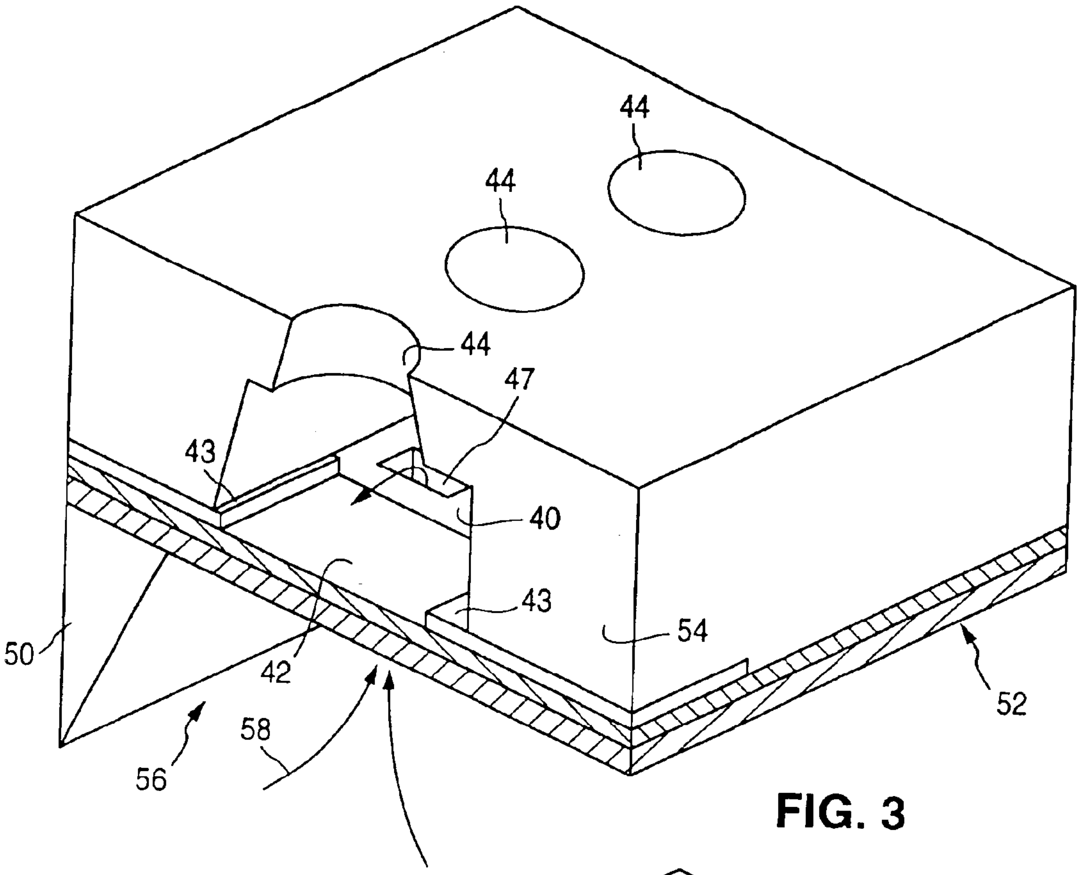
FIG. 3 is a cross-sectional, perspective view of a portion of another monolithic printhead disclosed in a previous application assigned to Hewlett-Packard.
Figure 4:
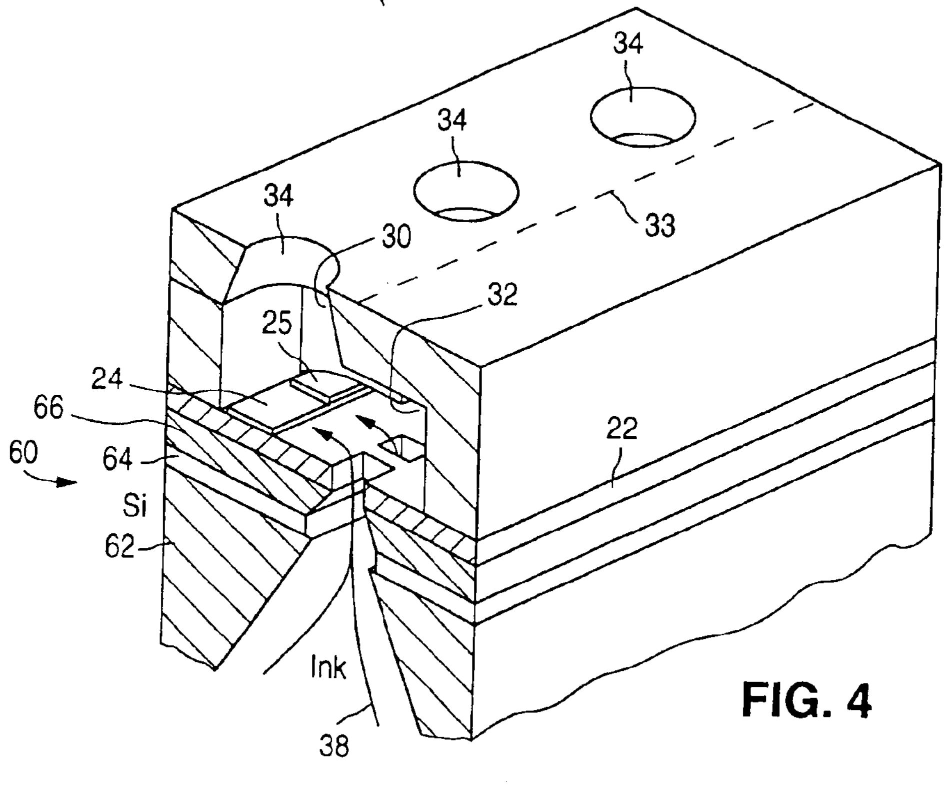
FIG. 4 is a cross-sectional, perspective view of a portion of a monolithic printhead similar to that of FIG. 2 but using a SOI wafer as the starting substrate to achieve a more precise trench width.

FIG. 4 is a cross-sectional view of a portion of the printhead of FIG. 1 taken along line 2—2. Although a printhead may have 300 or more nozzles and associated ink ejection chambers, detail of only a single ink ejection chamber need be described in order to understand the invention. It should also be understood by those skilled in the art that many printheads are formed on a single silicon wafer and then separated from one another using conventional techniques, such as sawing. Since FIG. 4 is similar to FIG. 2 except for the process for forming the trench and ink feed holes, only the differences between the structures will be described. Elements having the same numerals in the various figures may be identical to one another.

In FIG. 4, the various thin film layers 22 are formed over a silicon-on-insulator (SOI) wafer 60 comprising a silicon substrate 62 portion, a thermal oxide layer 64 grown over the substrate 62, and a thin silicon layer 66 over oxide 64. In one embodiment, substrate 62 is approximately 660 microns thick, oxide layer 64 is approximately 5,000 Angstroms thick, and silicon layer 66 is approximately 10 microns thick. The silicon layers have an orientation of <100> or <110>.

As seen from FIG. 4, there is a shelf formed by silicon layer 66 overhanging the silicon substrate 62.

One embodiment for forming the structure of FIG. 4 is described with respect to FIGS. 5–10.

Figure 5:
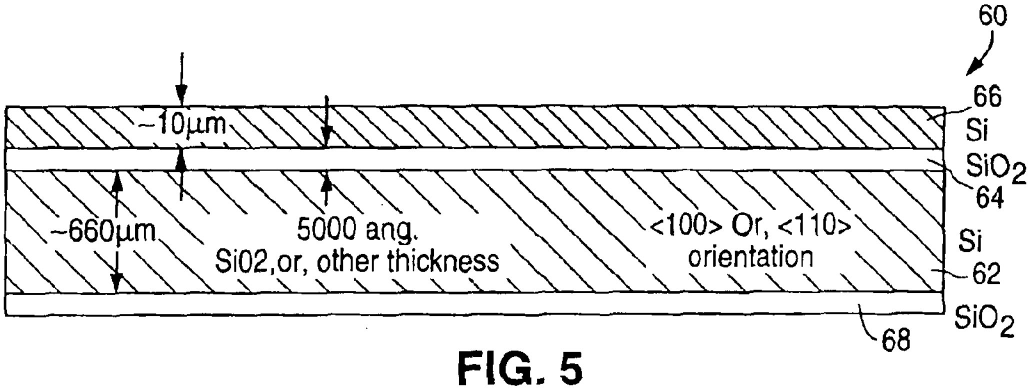
FIGS. 5–10 are cross-sectional views of a portion of a SOI wafer showing various steps used in one process for forming a monolithic printhead in accordance with the present invention.

In FIG. 5, a SOI wafer 60 is shown as received from a commercial supplier of wafers, such as Mitsubishi Silicon America (MSA). SOI wafers are well known and typically are formed by growing an oxide 64 over a silicon substrate 62, then placing another oxidized silicon wafer over the oxide 64 so that the oxide is sandwiched between the two silicon layers. The wafers are then pressed together and subjected to high temperature and pressure, which bonds the oxide layers together. The top silicon substrate is lapped and then mechanically and chemically polished to achieve the desired thickness. The thin silicon layer is identified as layer 66 in FIG. 5. The above process and other processes for forming SOI wafers are very well known.

The SOI wafer 60 is also provided with a bottom oxide layer 68, approximately 5000 Angstroms thick.

Figure 6:
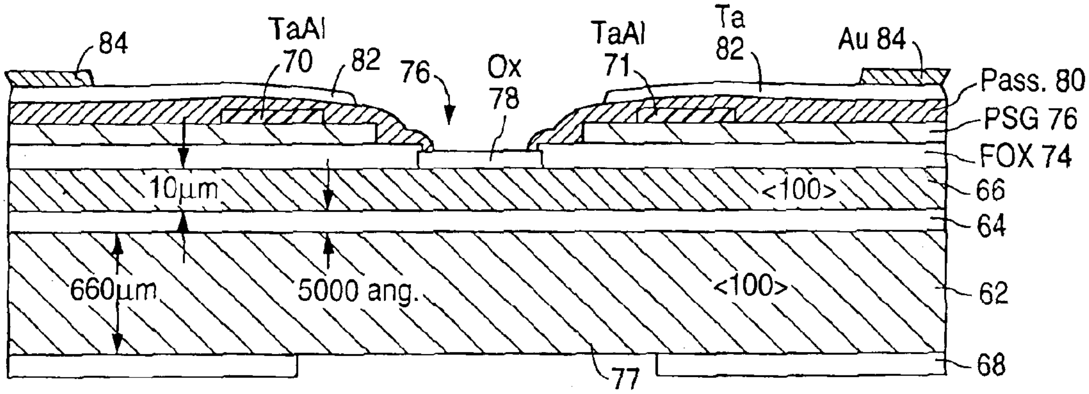

FIG. 6 is a cross-sectional view of a small portion of the wafer for a single printhead along line 2—2 in FIG. 1. Ultimately, an ink channel will be formed through the center portion of the structure of FIG. 6 so that ink will be allowed to flow from an ink reservoir, to the top surface of the substrate, and into vaporization chambers surrounding heater resistors 70 and 71.

Additional detail of a thin film layer process similar to that described below is disclosed in the various applications by Naoto Kawamura, previously identified and incorporated by reference, so such details will not be repeated.

A layer of field oxide (FOX) 74 is grown over silicon layer 66, using conventional techniques, to a thickness of approximately 1.2 microns.

Next, a phosphosilicate glass (PSG) layer 76 is deposited, using conventional techniques, to thickness on the order of 0.5 microns.

The PSG layer 76 is then masked and etched to expose a portion of the FOX 74. The FOX 74 is masked and etched (using a plasma etch) to form an opening 76. At the same time or in a subsequent step, FOX 68 is masked and etched to form an opening 77. Note that the PSG layer 76 is pulled back from the edges of the FOX 74 opening so as to protect the PSG layer 76 from ink after passivation (to be described later).

Next, a layer of oxide is deposited and etched to form oxide layer 78. Oxide layer 78 protects the silicon layer 66 from a subsequent TMAH etch. Alternatively, instead of using oxide layer 78 to protect the silicon layer 66 during the subsequent TMAH etch, a jig may be used.

A layer of TaAl, on the order of 0.1 microns thick, is deposited and etched to form the heater resistors 70 and 71.

Next, a conductive AlCu layer is deposited and etched to form the various contacts for the individual resistors. The etched AlCu is out of the plane of FIG. 6, but is shown as conductor 25 in FIG. 4.

A passivation layer (nitride) 80 is then deposited and etched to expose oxide layer 78. The passivation layer 80 may also include a layer of carbide. The passivation layer 80 is then masked and etched using conventional techniques to expose portions of the AlCu conductive traces (outside the field of view) for electrical contact to a subsequent gold conductive layer.

An adhesive layer of tantalum 82 and a conductive layer of gold 84 are deposited over the wafer, then masked and etched using conventional techniques to form the ground lines, terminating in bond pads along edges of the substrate. The exposed portions of the resistors 70 and 71 are outside the field of view of FIG. 6.

The process for forming the thin film layers may also be that in the previously-identified applications or that used to form any other thin film layer for a printhead.

Figure 7:
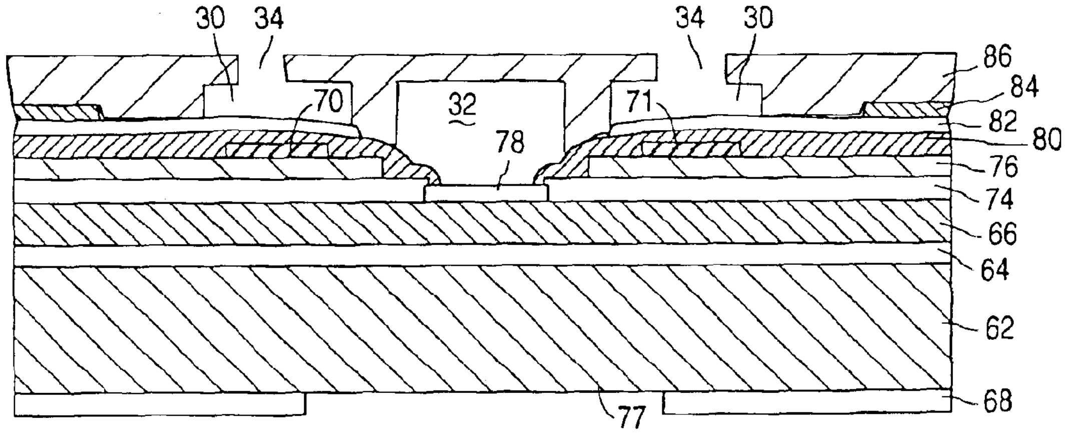

In FIG. 7, a layer of photoresist (e.g., SU8) is spun on to a thickness of approximately 10 microns or greater to ultimately to be used as the orifice layer 86. Any technique for forming an orifice layer may be used. In one embodiment, the photoresist is a negative photoresist. A first mask exposes all areas of the photoresist to a full dose of UV light, except where the manifold 32 and vaporization chambers 30 are to be formed. A second mask exposes all portions of the photoresist to a half dose of UV light except the areas where nozzles 34 are to be formed. This second exposure step hardens the top of the photoresist over the manifold 32 and vaporization chambers 30 except where the nozzles 34 are to be formed. The photoresist is then developed, resulting in the nozzles 34, manifold 32, and vaporization chambers 30 being formed.

Figure 8:
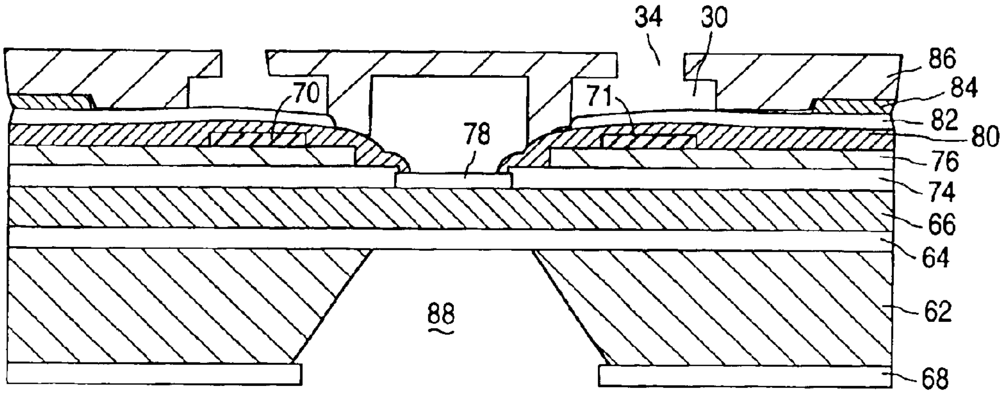
Figure 9:
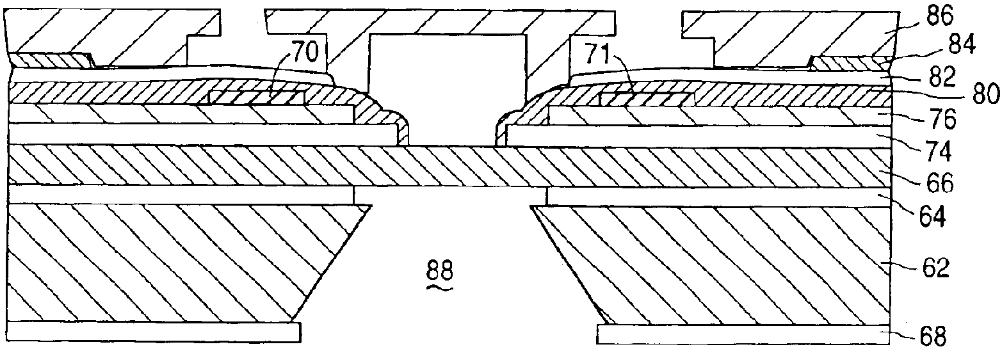

Next, referring to FIG. 8, the resulting wafer is dipped in a TMAH wet etch solution that etches through the silicon substrate 62 along the crystalline plane, and the oxide layer 64 acts as an etch stop. The TMAH solution also enters the orifices in the orifice layer 86, but the oxide layer 78 prevents etching of the silicon layer 66. Any suitable wet anisotropic etchant (e.g., KOH) may be used.

The wafer is subjected to a buffered oxide etch (BOE) to remove the exposed portions of the oxide layer 64 and oxide layer 78.

Figure 10:
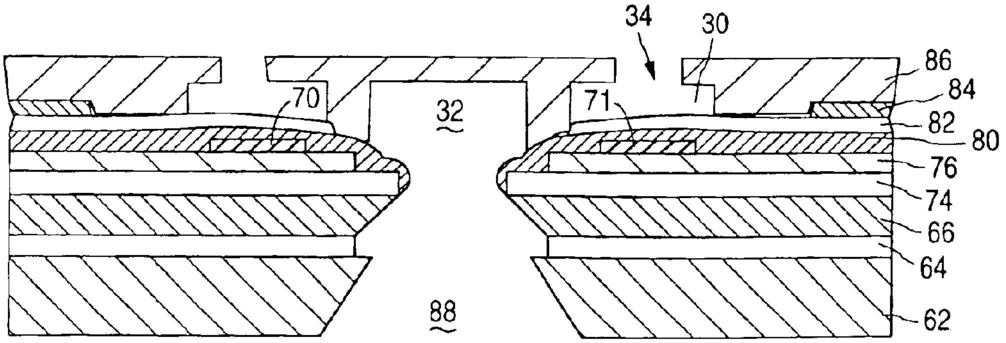

Next, as shown in FIG. 9, the wafer is again subjected to a TMAH etch, which etches through the thin silicon layer 66 to form the structure of FIG. 10. As seen, the two-step etching process (first etching the thick silicon substrate 62, then etching the thin silicon layer 66) provides more control over the width of the trench 88 formed in the substrate 62 due to the oxide etch stop. Further, the two-step etching process provides much better control over the width of the opening in the thin silicon layer 66, since the etch time of the thin silicon layer (e.g., 10 minutes) is much more predictable than the etch time needed to etch through an entire wafer thickness. Hence, the shelf length of the silicon layer 66 can be tightly controlled. This provides a more predictable mechanical support for the thin film layers and a robust heat transfer layer for the heater resistors to transfer heat from the resistors, through the thin silicon layer 66, and to the bulk silicon substrate 62 and ink.

FIG. 11 illustrates another embodiment of a monolithic printhead using an SOI wafer, composed of a silicon substrate 90, an oxide layer 92, and a thin silicon layer 94. The thin silicon layer 94 remains after etching a trench 96 in the silicon substrate 90 so as to form a relatively wide silicon membrane bridge that not only supports the thin film layers 52 but also conducts heat from the heater resistors 42 to the substrate 90 and ink 58. Ink feed holes through the thin silicon layer 94 are formed using a TMAH etch or a dry etch. The dry etch may be carried out using an STS anisotropic dry etcher. The ink feed holes through the thin silicon layer 94 may be individual holes or may be a trench (like FIG. 4) along the length of the printhead. There is no ink manifold in FIG. 11 because the ink feed holes lead directly into the vaporization chambers.

FIG. 12 is a cross-sectional view along line 12—12 in FIG. 11, where the ink holes 96 formed through the thin silicon layer 94 are made by using a dry etch rather than a wet etch. Thin film layers 52, including resistor 42, as well as orifice layer 54 and oxide layer 92 are also shown. Ink 58 is shown entering holes 96. FIG. 13 is a simplified view of the structure of FIG. 12.

Figure 14:
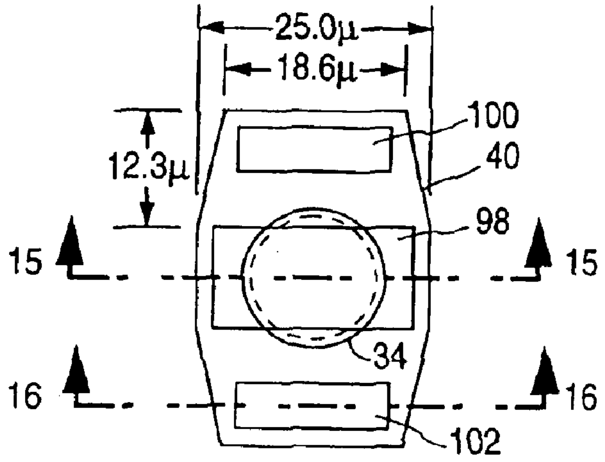
FIG. 14 is a top down view of a single vaporization chamber showing a central heater resistor and two ink feed holes, when the printhead is formed using a non-SOI wafer.

Leaving a thin silicon layer beneath the heater resistors to achieve the various advantages described above need not require a SOI wafer. FIG. 14 is a top down view of a single vaporization chamber 40 in a printhead including a heater resistor 98 and two ink feed holes 102 and 104. A tapered nozzle 34 is shown above the resistor 98.

Figure 15:
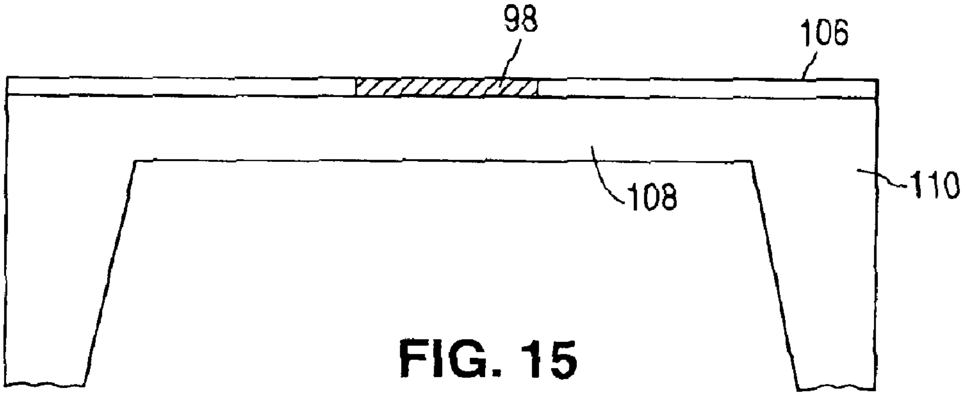
FIG. 15 is a cross-sectional, perspective view of a portion of a monolithic printhead, along line 15—15 in FIG. 14, where a thin silicon membrane supports the heater resistors.

FIG. 15 is a cross-sectional view of the printhead along line 15—15 in FIG. 14. The heater resistor 98 is formed in a thin film layer 106, as previously described, and overlies a thin silicon membrane 108 approximately 10–100 microns thick. The starting silicon substrate 110 is approximately 675 microns thick. The substrate 110 is not a SOI substrate. The wafer is subjected to a TMAH wet etch until the thin silicon membrane 108 remains beneath the resistor 98 and has a suitable width for the particular design of the ink channels.

Figure 16:
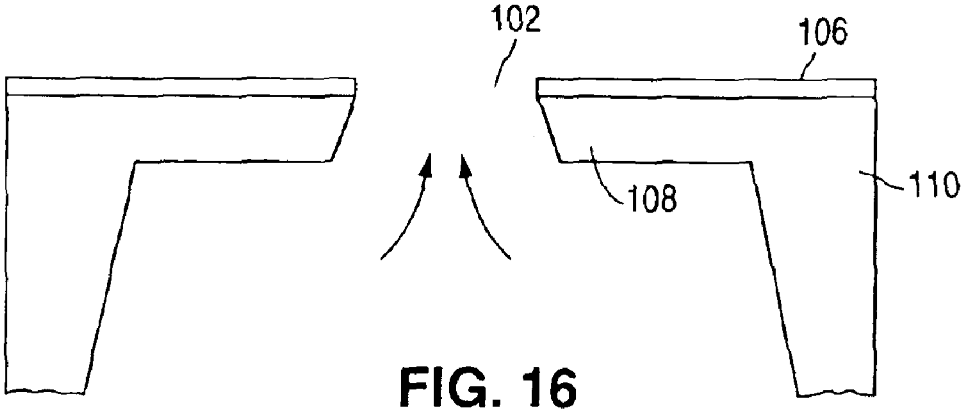
FIG. 16 is a cross-sectional, perspective view of a portion of a monolithic printhead, along line 16—16 in FIG. 14, showing the formation of ink feed holes through the silicon membrane.

A dry etch is then conducted, preferably from the front side of the wafer (rather than through the trench) to form the ink feed holes 102, out of the plane of FIG. 15 but shown in FIG. 16. FIG. 16 is a cross-sectional view along line 16—16 in FIG. 14 across ink feed hole 102 showing the dry etch through the thin silicon membrane 108. The dry etch can be vertical or tapered to about 10% off vertical.

In one variation of the various embodiments described, the ink feed holes are completely etched through the substrate prior to the formation of the orifice layer.

In another embodiment, the thin film layers, containing the heater resistor layer, are formed over either the SOI wafer or the all-silicon wafer, and the etching of ink feed holes through the thin film layers and the upper surface of the silicon wafer is conducted from the top side of the wafer rather than through the backside. Such etching through the upper silicon surface may be performed using a dry etch or a wet etch. A TMAH trench etch is then conducted to etch an exposed portion of the backside of the silicon wafer to meet with the ink feed holes etched into the upper surface of the wafer. In the case of an SOI wafer, the oxide layer between the two silicon layers is used as an etch stop and leads to much better control of etched critical dimensions and uniformity.

Accordingly, in the various embodiments described, a thin silicon layer remains beneath the heater resistors or resides proximate to the heater resistors, and a relatively wide trench is formed in the thicker silicon portion of the wafer. The resulting thin silicon layer beneath or proximate to the heater resistors provides mechanical support for the thin film layers in the vicinity of the vaporization chambers, prevents buckling of the thin film layers, and provides greater heat transfer from the heater resistors to the bulk silicon and the ink. Additionally, the back surface of the thin film membrane is not exposed to ink so the heated thin film membrane could not cause bubble formation on the back surface of the membrane.

One skilled in the art of integrated circuit manufacturing would understand the various techniques used to form the printhead structures described herein. The thin film layers and their thicknesses may be varied, and some layers deleted, while still obtaining the benefits of the present invention. Piezoelectric elements may be used instead of heater resistors as the ink ejection elements.

Figure 17:
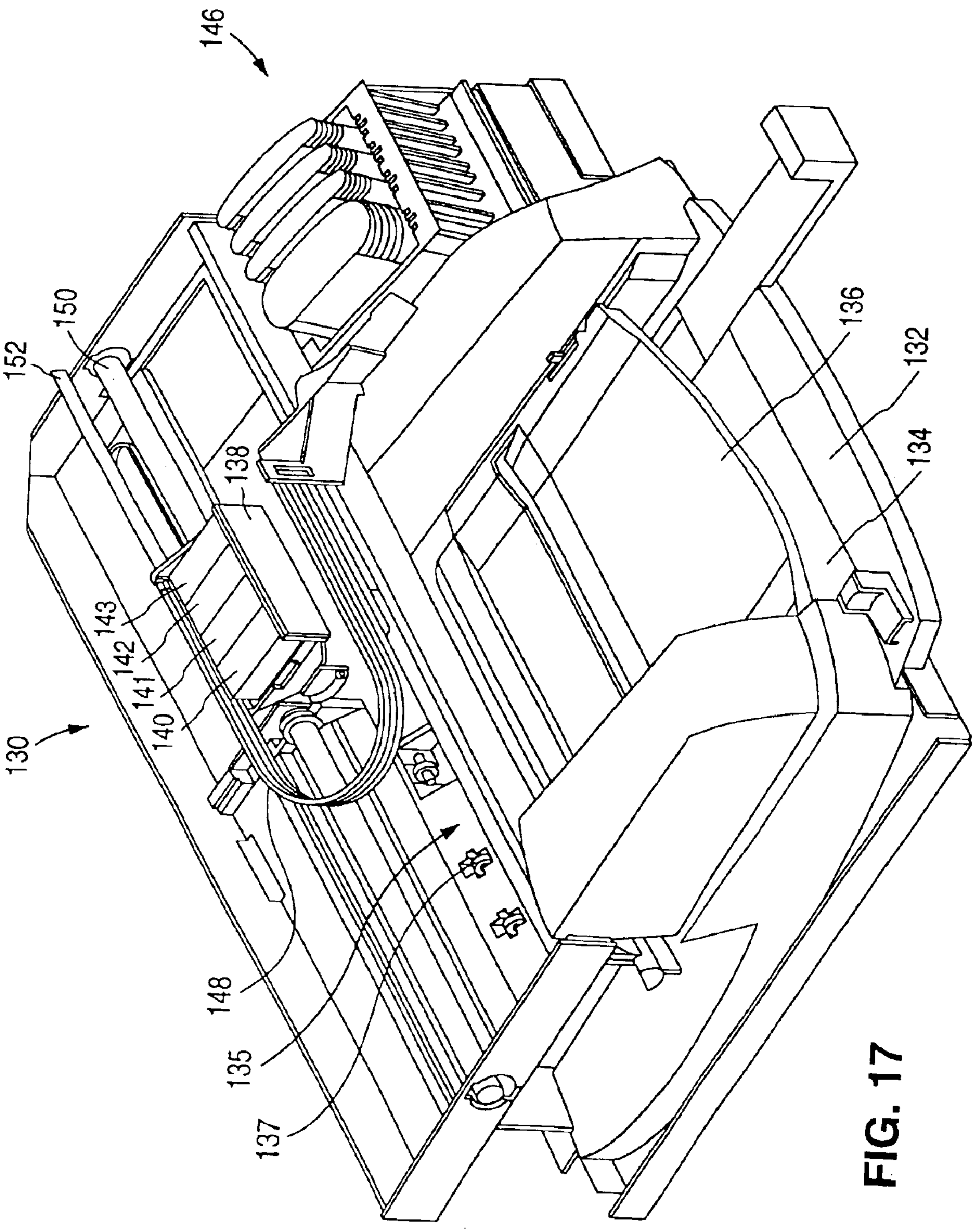
FIG. 17 illustrates a printer that can incorporate the printheads of the present invention.

FIG. 17 illustrates one embodiment of an inkjet printer 130 that can incorporate the invention. Numerous other designs of inkjet printers may also be used along with this invention. More detail of an inkjet printer is found in U.S. Pat. No. 5,852,459, to Norman Pawlowski et al., incorporated herein by reference.

Inkjet printer 130 includes an input tray 132 containing sheets of paper 134 which are forwarded through a print zone 135, using rollers 137, for being printed upon. The paper 134 is then forwarded to an output tray 136. A moveable carriage 138 holds print cartridges 140–143, which respectively print cyan (C), black (K), magenta (M), and yellow (Y) ink.

In one embodiment, inks in replaceable ink cartridges 146 are supplied to their associated print cartridges via flexible ink tubes 148. The print cartridges may also be the type that hold a substantial supply of fluid and may be refillable or non-refillable. In another embodiment, the ink supplies are separate from the printhead portions and are removeably mounted on the printheads in the carriage 138.

The carriage 138 is moved along a scan axis by a conventional belt and pulley system and slides along a slide rod 150. In another embodiment, the carriage is stationery, and an array of stationary print cartridges print on a moving sheet of paper.

Printing signals from a conventional external computer (e.g., a PC) are processed by printer 130 to generate a bitmap of the dots to be printed. The bitmap is then converted into firing signals for the printheads. The position of the carriage 138 as it traverses back and forth along the scan axis while printing is determined from an optical encoder strip 152, detected by a photoelectric element on carriage 138, to cause the various ink ejection elements on each print cartridge to be selectively fired at the appropriate time during a carriage scan.

The printhead may use resistive, piezoelectric, or other types of ink ejection elements.

As the print cartridges in carriage 138 scan across a sheet of paper, the swaths printed by the print cartridges overlap. After one or more scans, the sheet of paper 134 is shifted in a direction towards the output tray 136, and the carriage 138 resumes scanning.

The present invention is equally applicable to alternative printing systems (not shown) that utilize alternative media and/or printhead moving mechanisms, such as those incorporating grit wheel, roll feed, or drum or vacuum belt technology to support and move the print media relative to the printhead assemblies. With a grit wheel design, a grit wheel and pinch roller move the media back and forth along one axis while a carriage carrying one or more printhead assemblies scans past the media along an orthogonal axis. With a drum printer design, the media is mounted to a rotating drum that is rotated along one axis while a carriage carrying one or more printhead assemblies scans past the media along an orthogonal axis. In either the drum or grit wheel designs, the scanning is typically not done in a back and forth manner as is the case for the system depicted in FIG. 17.

Multiple printheads may be formed on a single substrate. Further, an array of printheads may extend across the entire width of a page so that no scanning of the printheads is needed; only the paper is shifted perpendicular to the array.

Additional print cartridges in the carriage may include other colors or fixers.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of forming a printhead comprising:

providing a silicon-on-insulator (SOI) substrate comprising a first silicon layer, a thinner second silicon layer, and an oxide layer between said first silicon layer and said second silicon layer;

forming a plurality of thin film layers on a first surface of said substrate, at least one of said layers forming a plurality of ink ejection elements;

forming ink feed holes through said thin film layers; and forming at least one opening in said substrate by (a) etching said first silicon layer of said SOI substrate using a wet etch to etch a trench in said first silicon layer extending to said oxide layer; (b) etching at least one opening in said oxide layer; and (c) etching at least one opening in said second silicon layer to form an ink path between a backside of said SOI substrate and a topside of said SOI substrate to provide an ink path from a second surface of said substrate, through said substrate, and to said ink feed holes formed in said thin film layers, wherein said plurality of ink ejection elements reside over said first silicon layer.

2. The method of claim 1 further comprising:

forming an orifice layer over said thin film layers, said orifice layer defining a plurality of ink ejection chambers, wherein one of said ink jet ejection elements is included within each chamber, said orifice layer further defining a nozzle for each ink ejection chamber.

3. The method of claim 1 wherein said ink ejection elements reside on a silicon bridge between two portions of thicker silicon.

4. The method of claim 1 wherein said trench extends at least a length of a row of said ink ejection elements.

5. The method of claim 1 wherein said etching step (c) is performing using a wet etch.

6. The method of claim 1 wherein said etching step (c) is performing using a dry etch.

* * * * *